United States Patent
Hsieh et al.

(10) Patent No.: US 7,756,280 B2
(45) Date of Patent: Jul. 13, 2010

(54) AUDIO PROCESSING SYSTEM AND METHOD FOR AUTOMATICALLY ADJUSTING VOLUME

(75) Inventors: Kuan-Hong Hsieh, Guangdong (CN); Xiao-Guang Li, Guangdong (CN); Wen-Chuan Lian, Guangdong (CN); Wen-Sheng Tsai, Guangdong (CN); Bing Li, Guangdong (CN)

(73) Assignees: Hong Fu Jin Precision Industry (Shen Zhen) Co., Ltd., Longhua Town, Bao'an District, Shenzhen, Guangdong Province; Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 890 days.

(21) Appl. No.: 11/562,954

(22) Filed: Nov. 22, 2006

(65) Prior Publication Data
US 2007/0126503 A1    Jun. 7, 2007

(30) Foreign Application Priority Data
Nov. 25, 2005   (TW) ............................... 94141492 A

(51) Int. Cl.
*H03G 3/00*   (2006.01)
*H03G 3/20*   (2006.01)

(52) U.S. Cl. ....................................... 381/107; 381/57
(58) Field of Classification Search ................ 381/72, 381/74, 56, 58, 104–108, 120, 121, 71.1, 381/94.1, 57; 379/395, 388.03, 390.01, 390.03
See application file for complete search history.

(56) References Cited

U.S. PATENT DOCUMENTS

| | | | | |
|---|---|---|---|---|
| 5,450,494 A | * | 9/1995 | Okubo et al. | 381/57 |
| 5,530,767 A | * | 6/1996 | Yoshida | 381/72 |
| 5,550,923 A | * | 8/1996 | Hotvet | 381/72 |
| 5,640,450 A | * | 6/1997 | Watanabe | 379/392 |
| 5,666,426 A | * | 9/1997 | Helms | 381/57 |
| 5,815,582 A | * | 9/1998 | Claybaugh et al. | 381/71.6 |
| 6,542,612 B1 | * | 4/2003 | Needham | 381/106 |
| 6,584,201 B1 | * | 6/2003 | Konstantinou et al. | 381/57 |
| 6,961,436 B1 | * | 11/2005 | Han | 381/104 |

(Continued)

FOREIGN PATENT DOCUMENTS

JP    2004-297747    10/2004

(Continued)

*Primary Examiner*—Curtis Kuntz
*Assistant Examiner*—Hai Phan
(74) *Attorney, Agent, or Firm*—Winston Hsu

(57) ABSTRACT

The present invention relates to an audio processing system and method for automatically adjusting volume. The method includes steps of: calculating a noise level as a reference noise level; periodically calculating a new noise level of a predetermined time period, and dividing the reference noise level by the new noise level to obtain a ratio; sampling digital audio signals generated by a decoding unit to obtain a plurality of amplitude values, periodically calculating an audio energy value of the predetermined time period; multiplying the audio energy value by the ratio to obtain a reference audio energy value; calculating a gain value according to the reference audio energy value and the default gain value; updating the default gain value with the gain value; and signaling the gain amplifier to amplify the analog audio signals received with the gain value, thereby protecting users' hearing.

9 Claims, 6 Drawing Sheets

U.S. PATENT DOCUMENTS

| | | | |
|---|---|---|---|
| 6,968,063 B2* | 11/2005 | Boyd | 381/57 |
| 7,003,123 B2* | 2/2006 | Kanevsky et al. | 381/72 |
| 7,469,051 B2* | 12/2008 | Sapashe et al. | 381/104 |
| 2005/0117754 A1* | 6/2005 | Sakawaki | 381/71.6 |
| 2005/0226428 A1* | 10/2005 | McIntosh et al. | 381/55 |

FOREIGN PATENT DOCUMENTS

| KR | 10-2005-0076959 | 7/2005 |
|---|---|---|

* cited by examiner

AUDIO PROCESSING SYSTEM AND METHOD FOR AUTOMATICALLY ADJUSTING VOLUME

BACKGROUND OF THE INVENTION

1. Field of the Invention

The present invention relates to an audio processing technology, and more particularly to an audio processing system and method for automatically adjusting volume according to variations of the ambient noise level.

2. General Background

The continuous development of new digital technologies has helped to make audio processing devices (such as an MP3 player) popular. Fidelity and quality of music output from the audio processing devices have also improved. However, when a listener is enjoying music in an environment whose noise level changes frequently, the listener needs to manually adjust volume accordingly. Consequently, it is irritating to the listener, and especially it is dangerous for the listener while driving a car.

In order to solve the problems mentioned, an related art provides an automatic volume control system for compensating ambient noise. The automatic volume control system automatically adjusts a gain value of a gain amplifier according to variations of the ambient noise level. However, a sound loudness depends more on the gain value of the gain amplifier, and not on the sound energy.

Therefore, a heretofore unaddressed need exists in the industry to overcome the aforementioned deficiencies and inadequacies.

SUMMARY OF THE INVENTION

The present invention provides an audio processing system and method for automatically adjusting volume. The audio processing system evaluates ambient noise level, and automatically adjusts audio energy value of a predetermined time period according to variations of the ambient noise level.

The audio processing system includes a command input unit, a storage unit, a processing unit, a decoding unit, a digital/analog converter, a microphone, an analog/digital converter and a gain managing unit. The command input generates a playing command and an adjusting command in response to operational inputs. The storage unit stores a plurality of audio files and a default gain value. The processing unit fetches one audio file from the plurality of audio files in response to the playing command. The decoding unit decodes the fetched audio file to generate digital audio signals. The digital/analog converter converts the digital audio signals to analog audio signals. The microphone collects ambient noises and generates corresponding analog noise signals. The analog/digital converter converts the analog noise signals to digital noise signals. The gain managing unit includes a noise processing module, an audio processing module, a gain calculating module and a gain adjusting module. The gain adjusting module adjusts the default gain value stored in the storage unit to an adjusted gain value, updates the default gain value with the adjusted gain value, and signals a gain amplifier to amplify the analog audio signals converted by the digital/analog converter with the adjusted gain value in response to the adjusting command. The noise processing module calculates a noise level of the digital noise signals, stores the noise level as a reference noise level, and periodically calculates a new noise level of the digital noise signals with a predetermined time period, and divides the new noise level by the reference noise level to obtain a ratio of the new noise level to the reference noise level. The audio processing module samples the digital audio signals by the decoding unit to obtain a plurality of amplitude values, and periodically calculates an audio energy value of the predetermined time period according to the amplitude values sampled within the predetermined time period and the default gain value. The gain calculating module multiplies the audio energy value by the ratio of the new noise level to the reference noise level to obtain a reference audio energy value, calculates a gain value according to the reference audio energy value and the default gain value, and updates the default gain value with the gain value. Wherein the gain adjusting module signals the gain amplifier to amplify the analog audio signals converted by the digital/analog converter with the gain value.

The audio processing system includes a command input unit, a storage unit, a processing unit, a decoding unit, a digital/analog converter, a microphone, an analog/digital converter and a gain managing unit. The command input generates a playing command and an adjusting command in response to operational inputs. The storage unit stores a plurality of audio files and a default gain value. The processing unit fetches one audio file from the plurality of audio files in response to the playing command. The decoding unit decodes the fetched audio file to generate digital audio signals. The digital/analog converter converts the digital audio signals to analog audio signals. The microphone collects ambient noises and generates corresponding analog noise signals. The analog/digital converter converts the analog noise signals to digital noise signals. The processing unit includes a gain adjusting module, a noise processing module, an audio processing module and a gain calculating module. The gain adjusting module adjusts the default gain value stored in the storage unit to an adjusted gain value, updates the default gain value with the adjusted gain value, and signals a gain amplifier to amplify the analog audio signals converted by the digital/analog converter with the adjusted gain value in response to the adjusting command. The noise processing module calculates a noise level of the digital noise signals, stores the noise level as a reference noise level, and periodically calculates a new noise level of the digital noise signals within a predetermined time period, and divides the new noise level by the reference noise level to obtain a ratio of the new noise level to the reference noise level. The audio processing module samples the digital audio signals generated by the decoding unit to obtain a plurality of amplitude values, and periodically calculates an audio energy value of the predetermined time period according to the amplitude values sampled within the predetermined time period and the default gain value. The gain calculating module multiplies the audio energy value by the ratio of the new noise level to the reference noise level to obtain a reference audio energy value, calculates a gain value according to the reference audio energy value and the default gain value, and updates the default gain value with the gain value. Wherein the gain adjusting module signals the gain amplifier to amplify the analog audio signals converted by the digital/analog converter by the gain value.

The audio processing method includes steps of: receiving an adjusting command; adjusting a default gain value stored in a storage unit to an adjusted gain value, and updating the default gain value with the adjusted gain value; signaling a gain amplifier to amplify analog audio signals converted by a digital/analog converter with the adjusted gain value; calculating a noise level, and storing the noise level in the storage unit as a reference noise level; periodically calculating a new noise level of a predetermined time period, and dividing the new noise level by the reference noise level to obtain a ratio of the new noise level to the reference noise level; sampling digital audio signals generated by a decoding unit to obtain a plurality of amplitude values, and periodically calculating an audio energy value of the predetermined time period according to the amplitude values sampled within the predetermined time period and the default gain value; multiplying the audio energy value by the ratio of the new noise level to the reference noise level to obtain a reference audio energy value; calculating a gain value according to the reference audio energy value and the default gain value; updating the default gain value with the gain value; and signaling the gain amplifier to amplify the analog audio signals converted by the digital/analog converter by the gain value.

Other systems, methods, features, and advantages will be or become apparent to one with skill in the art upon examination of the following drawings and detailed description. It is intended that all such additional systems, methods, features, and advantages be included within this description, be within the scope of the present invention, and be protected by the accompanying claims.

DETAILED DESCRIPTION OF THE INVENTION

The audio processing system of the present invention can automatically adjust volume according to variations of the ambient noise level. The audio processing system can be incorporated in a car stereo system and portable electrical devices such as an MP3 player, an electronic book, a mobile telephone, and so on. The following detailed description of the embodiments is made with reference to the attached drawings.

Figure 1:
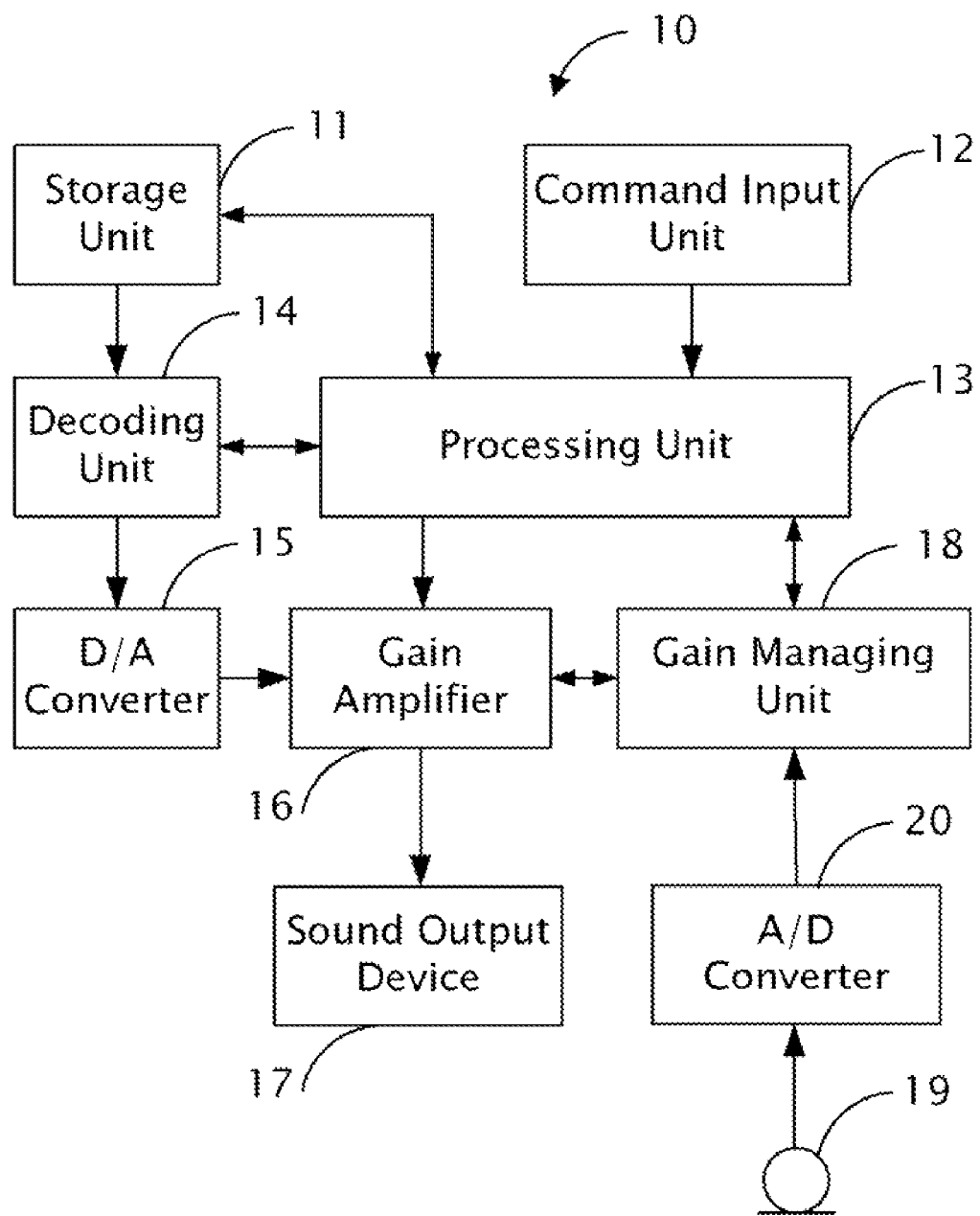
FIG. 1 is a block diagram of a hardware infrastructure of an audio processing system for automatically adjusting volume in accordance with a preferred embodiment of the present invention.

FIG. 1 is a block diagram of a hardware infrastructure of an audio processing system for automatically adjusting volume in accordance with a preferred embodiment of the present invention. The audio processing system 10 includes a storage unit 11, a command input unit 12, a processing unit 13, a decoding unit 14, a digital/analog (D/A) converter 15, a gain amplifier 16, and a sound output device 17.

The storage unit 11 stores a plurality of audio files, a default gain value, and a decoding program. The storage unit 11 can be a flash storage, a hard disk driver, and the like. The processing unit 13 controls components of the audio processing system 10. The processing unit 13 can be a digital signal processor (DSP), a processing unit (CPU), and the like.

The command input unit 12 generates control commands after receiving operational inputs. The control commands include a playing command for playing an audio file, and an adjusting command for adjusting a gain value of the gain amplifier 16. The processing unit 13 fetches the audio file to be played from the storage unit 11 after receiving the playing command.

The decoding unit 14 invokes the decoding program stored in the storage unit 11, decodes the audio file fetched by the processing unit 13, generates digital audio signals, and sends the digital audio signals to the D/A converter 15. The D/A converter 15 converts the digital audio signals generated by the decoding unit 14 into analog audio signals.

The gain amplifier 16 amplifies the analog audio signals converted by the D/A converter 15 with the default gain value stored in the storage unit 11, thereby yielding amplified analog audio signals. The sound output device 17 receives the amplified analog audio signal and produces corresponding sounds. The sound output device 17 can be an earphone or a speaker.

The audio processing system 10 further includes a gain managing unit 18 integrated with the processing unit 13, a microphone 19, and an analog/digital (A/D) converter 20. The microphone 19 collects ambient noises and generates corresponding analog noise signals. The analog/digital converter 20 converts the analog noise signals to digital noise signals, and sends the digital noise signals to the gain managing unit 18.

Figure 2:
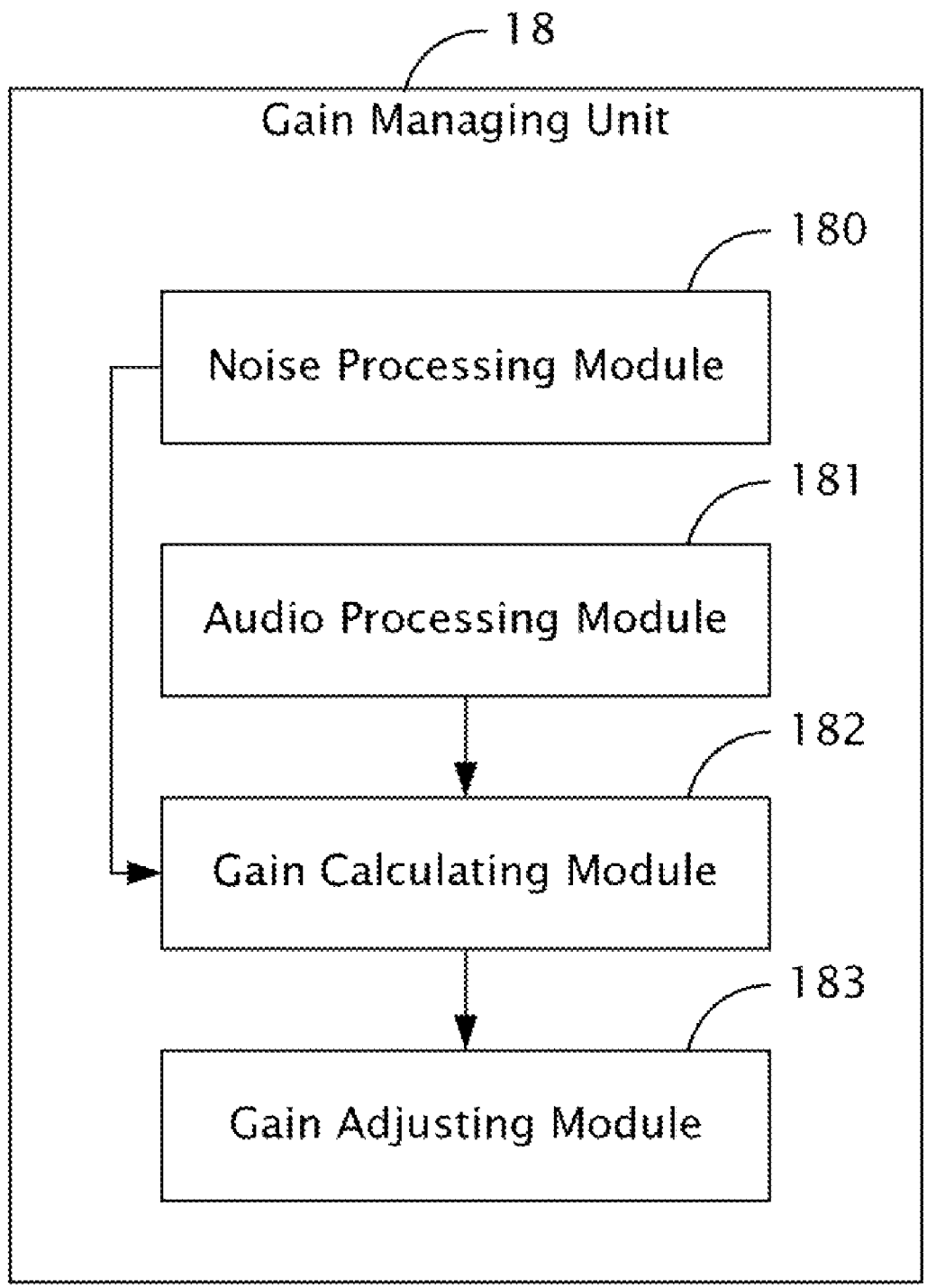
FIG. 2 is a schematic diagram of main function modules of a gain managing unit of FIG. 1.

Referring to FIG. 2, the gain managing unit 18 includes a noise processing module 180, an audio processing module 181, a gain calculating module 182, and a gain adjusting module 183. The noise processing module 180 receives the digital noise signals sent from the analog/digital converter 20, calculates a noise level of the digital noise signals, and stores the noise level in the storage unit 11 as a reference noise level. The noise processing module 180 periodically calculates a new noise level of the digital noise signals within a predetermined time period, and divides the new noise level by the reference noise level to obtain a ratio of the new noise level to the reference noise level.

The audio processing module 181 samples the digital audio signals generated by the decoding unit 14 to obtain a plurality of amplitude values, obtains the default gain value stored in the storage unit 11, and periodically calculates an audio energy value of the digital audio signals within the predetermined time period. The audio energy value is calculated according to the default gain value and the plurality of amplitude values by: $Q=[\Sigma(mi*V)^2/N]^{1/2}$, wherein N represents a count of the amplitude values sampled within the predetermined time period, i is any natural number from 1 to N, V represents the default gain value, mi represents the amplitude values sampled within the predetermined time period, Q represents the audio energy value of the predetermined time period.

The gain calculating module 182 multiplies the audio energy value by the ratio of the new noise level to the reference noise level to obtain a reference audio energy value, reads the default gain value stored in the storage unit 11, calculates a new gain value for calculating the audio energy value, and updates the default gain value with the new gain value.

The gain adjusting module 183 signals the gain amplifier 16 to amplify the analog audio signals received from the D/A converter 15 with the new gain value.

Figure 3:
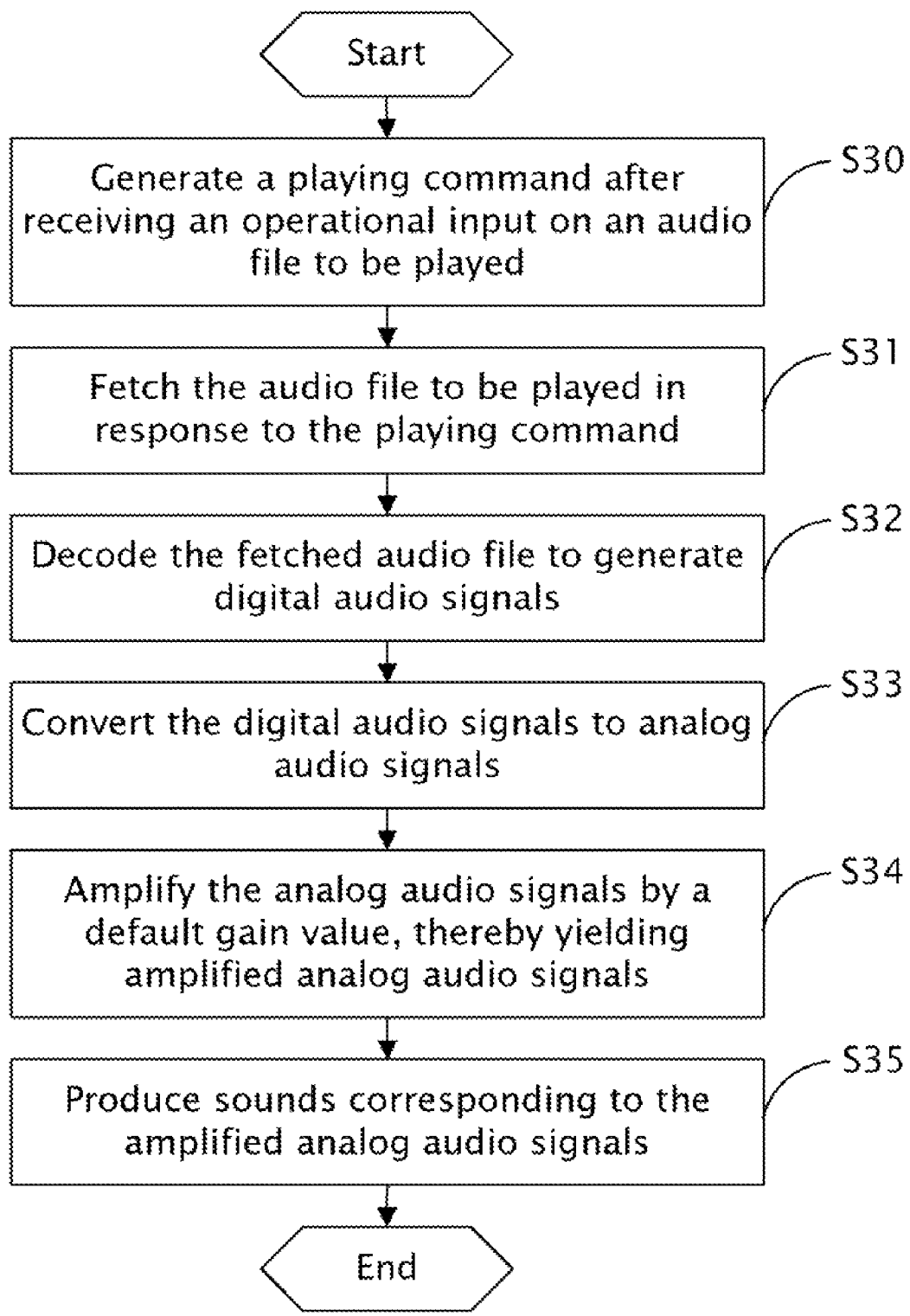
FIG. 3 is a common flowchart of playing an audio file.

FIG. 3 is a common flowchart for playing an audio file. In step S30, the command input unit 12 generates the playing command after receiving the operational input on one audio file of the plurality of audio files stored in the storage unit 11.

In step S31, the processing unit 13 fetches the audio file from the plurality of audio files in response to the playing command.

In step S32, the decoding unit 14 decodes the fetched audio file to generate the digital audio signals, and sends the digital audio signals to the D/A converter. In step S33, the D/A converter 15 converts the digital audio signals to the analog audio signals.

In step S34, the gain managing unit 13 controls/signals the gain amplifier 16 to amplify the analog audio signals with the default gain value stored in the storage unit 11, thereby yielding amplified analog audio signals. In step S35, the sound output device 17 receives the amplified analog audio signals and produces corresponding sounds.

Figure 4:
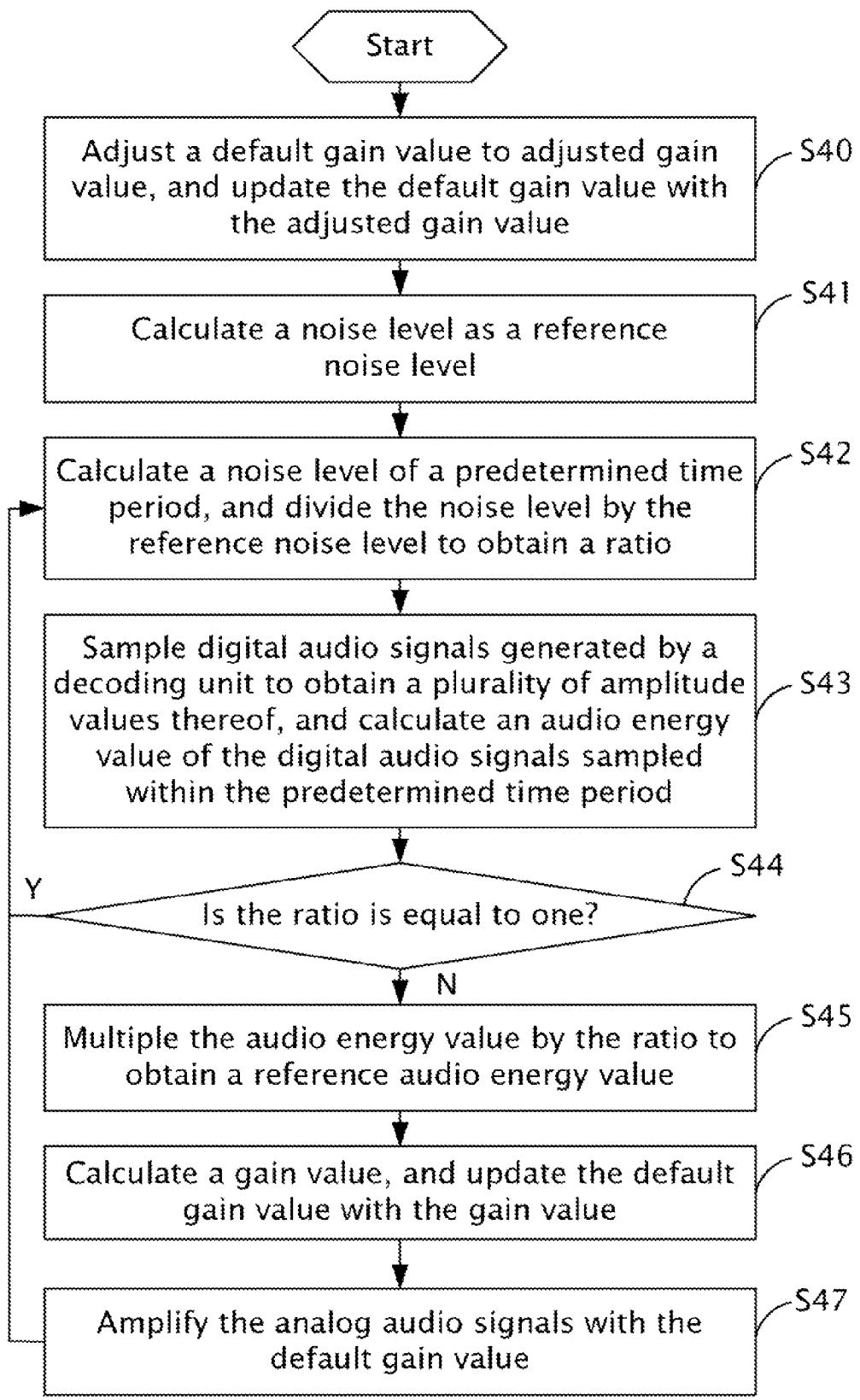
FIG. 4 is a flowchart of a preferred audio processing method for automatically adjusting volume by utilizing the audio processing system of FIG. 1 in according with the preferred embodiment of the present invention.

FIG. 4 is a flowchart of a first preferred audio processing method for automatically adjusting volume by utilizing the audio processing system 10 of FIG. 1. In step S40, the gain adjusting module 183 adjusts the default gain value stored in the storage unit 11 to an adjusted gain value in response to the adjusting command, signals the gain amplifier 16 to amplify the analog audio signals received from the D/A converter 15 with the adjusted gain value, and updates the default gain value with the adjusted gain value.

In step S41, the noise processing module 180 receives the digital noise signals from the analog/digital converter 20, calculates a noise level of the digital noise signals, and stores the noise level in the storage unit 11 as the reference noise level.

In step S42, the noise processing module 180 periodically calculates a new noise level of the digital noise signals of the predetermined time period, and divides the new noise level by the reference noise level to obtain a ratio of the new noise level to the reference noise level.

In step S43, the audio processing module 181 samples the digital audio signals generated by the decoding unit 14, obtains the plurality of amplitude values of the digital audio signals, obtains the default gain value stored in the storage unit 11, and periodically calculates the audio energy value of the digital audio signals within the predetermined time period according to the default gain value and the plurality of amplitude values.

In step S44, the gain calculating module 182 detects if the ratio of the new noise level to the reference noise level equals to one. If the ratio of the new noise level to the reference noise level equals to one, the procedure goes to step S42; otherwise, in step S45, the gain calculating module 182 multiplies the audio energy value calculated by the ratio of the new noise level to the reference noise level to obtain a reference audio energy value, and obtains the default gain value stored in the storage unit 11.

In step S46, the gain calculating module 182 calculates the new gain value for calculating the audio energy value according to the reference audio energy value and the default gain value, and updates the default gain value with the new gain value.

In step S47, the gain adjusting module 183 signals the gain amplifier 16 to amplify the analog audio signals by the new gain value, and the procedure goes to step S42. The step S42 to step S47 is performed recursively until the audio processing system 10 receives another adjusting command for adjusting the default gain value. The step S40 to step S47 is performed recursively until the audio processing system 10 is turned-off.

Figure 5:
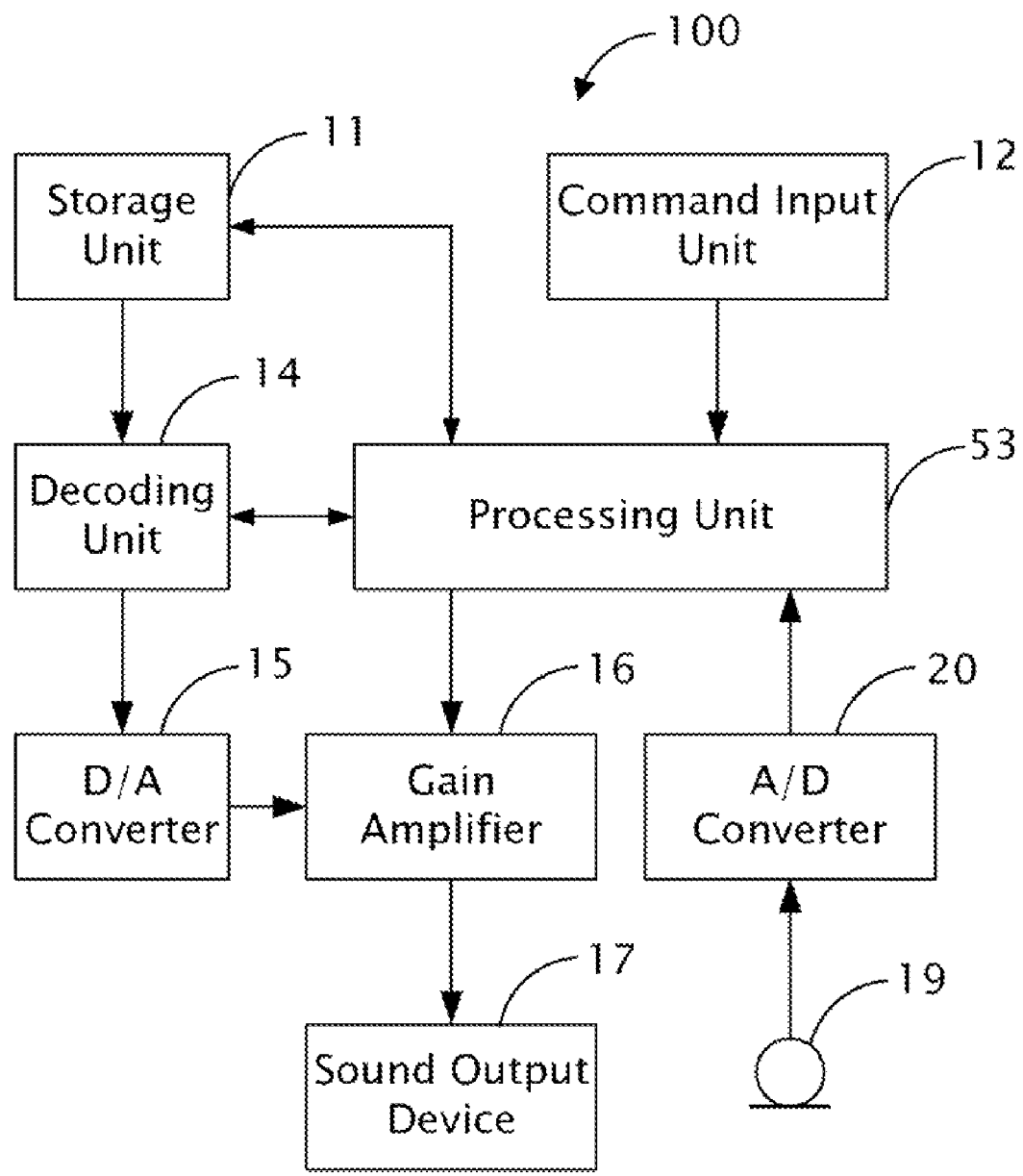
FIG. 5 is a block diagram of a hardware infrastructure of an audio processing system for automatically adjusting volume in accordance with an alternative preferred embodiment of the present invention.

FIG. 5 is a block diagram of a hardware infrastructure of an audio processing system 100 for automatically adjusting volume in accordance with an alternative embodiment of the present invention. The audio processing system 100 of the alternative embodiment is the same as that of the preferred embodiment, except that the gain managing unit 18 is configured in the processing unit 53.

Figure 6:
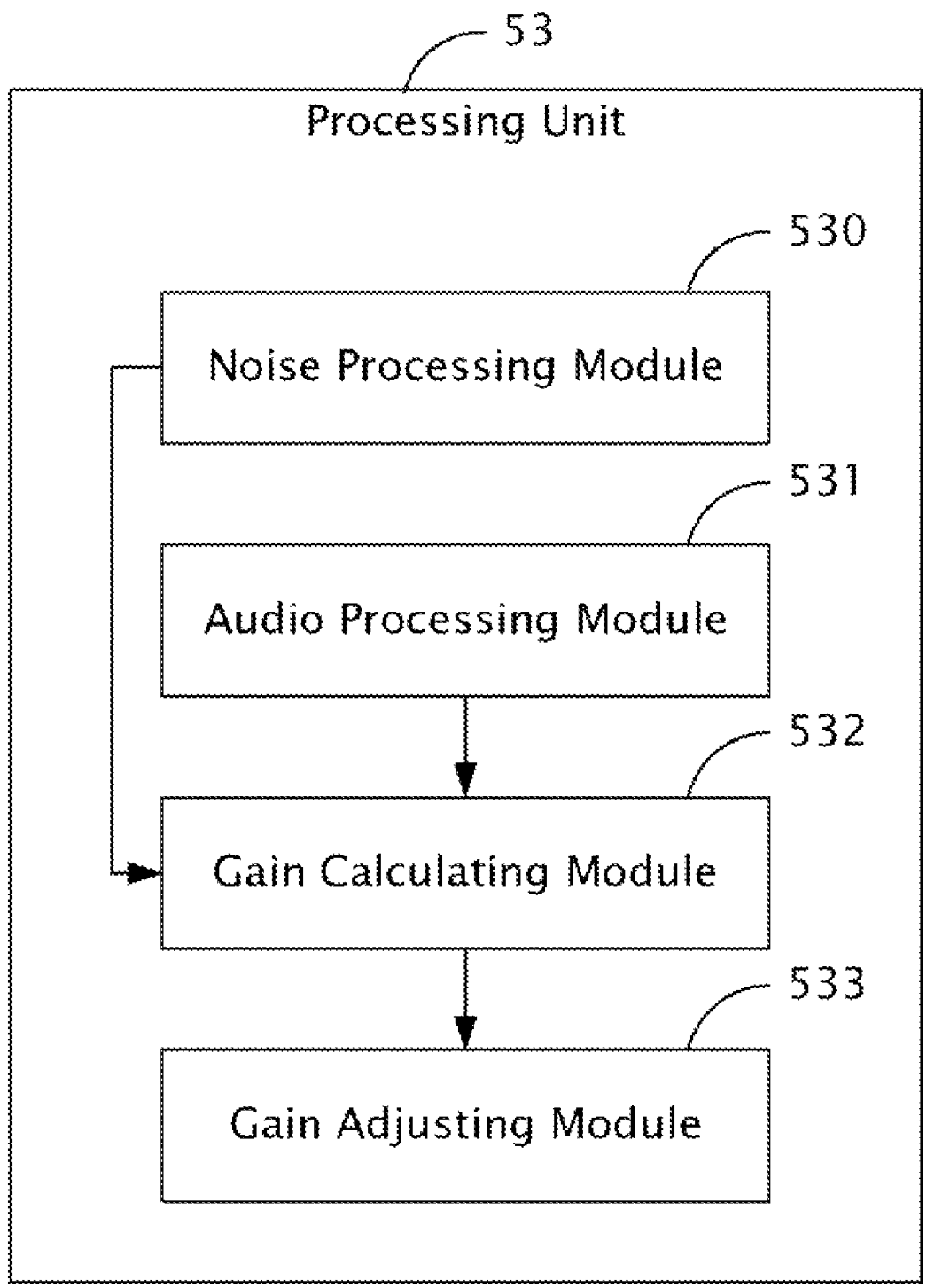
FIG. 6 is a schematic diagram of main function modules of a processing unit of FIG. 5.

Therefore, referring to FIG. 6 in the alternative embodiment, the processing unit 53 further has the function as well as the gain managing unit 18 in FIG. 1. That is, the processing unit 53 has a noise processing module 530, an audio processing module 531, a gain calculating module 532, and a gain adjusting module 533, which respectively performs the same functions as the noise processing module 180, the audio processing module 181, the gain calculating module 182, and the gain adjusting module 183 of the gain managing unit 18.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An audio processing system for automatically adjusting volume, the system comprising:

a command input unit for generating a playing command and an adjusting command in response to operational inputs;

a storage unit for storing a plurality of audio files and a default gain value;

a processing unit for fetching one audio file from the plurality of audio files in response to the playing command;

a decoding unit for decoding the fetched audio file to generate digital audio signals;

a digital/analog converter for converting the digital audio signals to analog audio signals;

a microphone for collecting ambient noises and generating corresponding analog noise signals;

an analog/digital converter for converting the analog noise signals to digital noise signals; and a gain managing unit comprising:

a gain adjusting module for adjusting the default gain value stored in the storage unit to an adjusted gain value, updating the default gain value with the adjusted gain value, and signaling a gain amplifier to amplify the analog audio signals converted by the digital/analog converter with the adjusted gain value, in response to the adjusting command;

a noise processing module for calculating a noise level of the digital noise signals, storing the noise level as a reference noise level, and periodically calculating a new noise level of the digital noise signals within a predetermined time period, and dividing the new noise level by the reference noise level to obtain a ratio of the new noise level to the reference noise level;

an audio processing module for sampling the digital audio signals generated by the decoding unit to obtain a plurality of amplitude values, and periodically calculating an audio energy value of the predetermined time period according to the amplitude values sampled within the predetermined time period and the default gain value; and a gain calculating module for multiplying the audio energy value by the ratio of the new noise level to the reference noise level to obtain a reference audio energy value, calculating a gain value according to the reference audio energy value and the default gain value, and updating the default gain value with the gain value;

wherein the gain adjusting module signals the gain amplifier to amplify the analog audio signals converted by the digital/analog converter with the gain value.

2. The audio processing system according to claim 1, wherein the audio processing module calculates the audio energy value by: $Q=[\Sigma(mi*V)2/N]1/2$, wherein N represents a count of the amplitude values sampled within the predetermined time period, i is any natural number from 1 to N, V represents the default gain value, mi represents the amplitude values sampled within the predetermined time period, Q represents the audio energy value of the predetermined time period.

3. The audio processing system according to claim 1, wherein the noise processing module and the audio processing module respectively recalculate the audio energy value of the predetermined time period and the ratio of the new noise level to the reference noise level, if the ratio of the new noise level to the reference noise level is equal to one.

4. An audio processing system for automatically adjusting volume, the system comprising:
   a command input unit for generating a playing command and an adjusting command in response to operational inputs;
   a storage unit for storing a plurality of audio files and a default gain value;
   a processing unit for fetching one audio file from the plurality of audio files in response to the playing command;
   a decoding unit for decoding the audio file to generate digital audio signals;
   a digital/analog converter for converting the digital audio signals to analog audio signals;
   a microphone for collecting ambient noises and generating corresponding analog noise signals;
   an analog/digital converter for converting the analog noise signals to digital noise signals; and
   a processing unit comprising:
      a gain adjusting module for adjusting the default gain value stored in the storage unit to an adjusted gain value, updating the default gain value with the adjusted gain value, and signaling a gain amplifier to amplify the analog audio signals converted by the digital/analog converter with the adjusted gain value, in response to the adjusting command;
      a noise processing module for calculating a noise level of the digital noise signals, storing the noise level as a reference noise level, and periodically calculating a new noise level of the digital noise signals within a predetermined time period, and dividing the new noise level by the reference noise level to obtain a ratio of the new noise level to the reference noise level;
      an audio processing module for sampling the digital audio signals generated by the decoding unit to obtain a plurality of amplitude values, and periodically calculating an audio energy value of the predetermined time period according to the amplitude values sampled within the predetermined time period and the default gain value; and
      a gain calculating module for multiplying the audio energy value by the ratio of the new noise level to the reference noise level to obtain a reference audio energy value, calculating a gain value according to the reference audio energy value and the default gain value, and updating the default gain value with the gain value;
   wherein the gain adjusting module signals the gain amplifier to amplify the analog audio signals converted by the digital/analog converter with the gain value.

5. The audio processing system according to claim 4, wherein the audio processing module calculates the audio energy by: $Q=[\Sigma(mi*V)2/N]1/2$, wherein N represents a count of the amplitude values sampled within the predetermined time period, i is any natural number from 1 to N, V represents the default gain value, mi represents the amplitude values sampled within the predetermined time period, Q represents the audio energy value of the predetermined time period.

6. The audio processing system according to claim 4, wherein the noise processing module and the audio processing module respectively recalculate the audio energy value of the predetermined time period and the ratio of the new noise level to the reference noise level, if the ratio of the new noise level to the reference noise level is equal to one.

7. An audio processing method for automatically adjusting volume, the method comprising steps of:
   receiving an adjusting command;
   adjusting a default gain value stored in a storage unit to an adjusted gain value, and updating the default gain value with the adjusted gain value;
   signaling a gain amplifier to amplify analog audio signals converted by a digital/analog converter with the adjusted gain value;
   calculating a noise level, and storing the noise level in the storage unit as a reference noise level;
   periodically calculating a new noise level within a predetermined time period, and dividing the new noise level by the reference noise level to obtain a ratio of the new noise level to the reference noise level;
   sampling digital audio signals generated by a decoding unit to obtain a plurality of amplitude values, and periodically calculating an audio energy value of a predetermined time period according to the amplitude values sampled within the predetermined time period and the default gain value;
   multiplying the audio energy value by the ratio of the new noise level to the reference noise level to obtain a reference audio energy value;
   calculating a gain value according to the reference audio energy value and the default gain value;
   updating the default gain value with the gain value; and
   signaling the gain amplifier to amplify the analog audio signals converted by the digital/analog converter with the gain value.

8. The audio processing method according to claim 7, wherein the audio processing module calculates the audio energy by: $Q=[\Sigma(mi*V)2/N]1/2$, wherein N represents a count of the amplitude values sampled within the predetermined time period, i is any natural number from 1 to N, V represents the default gain value, mi represents the amplitude values sampled within the predetermined time period, Q represents the audio energy value of the predetermined time period.

9. The audio processing method according to claim 7, wherein the procedure goes to recalculate the audio energy value of the predetermined time period and the ratio of the new noise level to the reference noise level, if the ratio of the new noise level to the reference noise level is equal to one.

* * * * *